United States Patent
Guo et al.

(10) Patent No.: US 8,570,107 B2
(45) Date of Patent: Oct. 29, 2013

(54) CLOCK GENERATING APPARATUS AND FREQUENCY CALIBRATING METHOD OF THE CLOCK GENERATING APPARATUS

(75) Inventors: Xiaochuan Guo, Austin, TX (US); Wen-Chang Lee, Taipei (TW); Chii-Horng Chen, Taichung (TW); Augusto Marques, Moscavide (PT)

(73) Assignee: MediaTek Singapore Pte. Ltd., Singapore (SG)

( * ) Notice: Subject to any disclaimer, the term of this patent is extended or adjusted under 35 U.S.C. 154(b) by 48 days.

(21) Appl. No.: 13/299,347

(22) Filed: Nov. 17, 2011

(65) Prior Publication Data

US 2012/0249195 A1    Oct. 4, 2012

Related U.S. Application Data

(60) Provisional application No. 61/470,684, filed on Apr. 1, 2011.

(51) Int. Cl.
*H03L 7/087* (2006.01)
*H03L 7/085* (2006.01)

(52) U.S. Cl.
USPC ............. 331/11; 331/16; 331/44; 327/156; 375/376

(58) Field of Classification Search
USPC ............ 327/147, 156; 331/10, 11, 16, 17, 44, 331/175, 177 R; 375/373–376
See application file for complete search history.

(56) References Cited

U.S. PATENT DOCUMENTS

| | | | |
|---|---|---|---|
| 5,511,100 A | 4/1996 | Lundberg | |
| 5,686,864 A * | 11/1997 | Martin et al. | 331/1 A |
| 6,859,073 B1 | 2/2005 | Dai | |
| 7,023,195 B2 * | 4/2006 | Rosenbaum et al. | 324/76.53 |
| 7,295,078 B2 * | 11/2007 | Coppola et al. | 331/44 |
| 7,330,079 B2 | 2/2008 | Williams, III | |
| 7,382,200 B2 | 6/2008 | Staszewski | |
| 7,432,749 B1 | 10/2008 | Gehring | |
| 7,545,222 B2 | 6/2009 | Chou | |
| 7,728,686 B2 * | 6/2010 | Zhan et al. | 331/179 |
| 8,207,767 B2 * | 6/2012 | Endo et al. | 327/156 |
| 8,248,127 B2 * | 8/2012 | Chan et al. | 327/172 |
| 2001/0033200 A1 | 10/2001 | Staszewski | |
| 2003/0171105 A1 | 9/2003 | Dunworth | |
| 2005/0137816 A1 | 6/2005 | Chuang | |
| 2007/0297488 A1 | 12/2007 | Chang | |
| 2009/0267664 A1 | 10/2009 | Uozumi | |
| 2010/0134192 A1 | 6/2010 | Min | |
| 2010/0141314 A1 | 6/2010 | Chen | |

FOREIGN PATENT DOCUMENTS

CN    101662260 A    3/2010
WO    2010135607 A1    11/2010

* cited by examiner

*Primary Examiner* — Levi Gannon
(74) *Attorney, Agent, or Firm* — Winston Hsu; Scott Margo (57) ABSTRACT

A clock generating apparatus includes: a time-to-digital converter (TDC) arranged to convert a timing difference between a reference clock and a variable clock to generate a digital value; a calibrating device arranged to generate a control signal according to the digital value and the reference clock; a controllable oscillator arranged to generate an oscillating signal according to the control signal and the digital value; and a feedback device arranged to generate the variable clock to the TDC according to the oscillating signal, and the calibrating device calibrates the controllable oscillator to make the oscillating signal have a target oscillating frequency.

11 Claims, 6 Drawing Sheets

FIG. 6

CLOCK GENERATING APPARATUS AND FREQUENCY CALIBRATING METHOD OF THE CLOCK GENERATING APPARATUS

CROSS REFERENCE TO RELATED APPLICATIONS

This application claims the benefit of U.S. Provisional Application No. 61/470,684, which was filed on Apr. 1, 2011 and is included herein by reference.

BACKGROUND

The present invention relates to a clock generating apparatus and a frequency calibrating method of the clock generating apparatus, and more particularly to a phase-locked loop applied in a multi-standard communication system having a short frequency calibrating time, and a method thereof.

In a wireless communication system, a phase-locked loop is utilized to generate a clock signal having a predetermined oscillating frequency to accommodate a specific communications standard. The phase-locked loop is designed to be able to generate different oscillating frequencies corresponding to different communications standards respectively. The frequency tuning range of an oscillator in the phase-locked loop should therefore be wide enough to accommodate the multi-communications standards. Conventionally, when a wireless communication system is to be operated under a specific communications standard, the oscillator is first controlled to search over the whole usable frequency range in order to calibrate the oscillator for outputting a target frequency corresponding to the specific communications standard. The conventional communication system may require a long time to search the target frequency when more and more communications standards are embedded into one wireless communication system. Therefore, speeding up the calibrating time of a phase-locked loop to generate the target frequency in a multi-standard communications system has become an important issue in the field.

SUMMARY

One of the objectives is to provide a phase-locked loop applied in a multi-standard communications system having a short frequency calibrating time, and a method thereof.

According to a first embodiment of the present invention, a clock generating apparatus is disclosed. The clock generating apparatus comprises a time-to-digital converter (TDC), a calibrating device, a controllable oscillator, and a feedback device. The TDC is arranged to convert a timing difference between a reference clock and a variable clock to generate a digital value. The calibrating device is arranged to generate a control signal according to the digital value and the reference clock. The controllable oscillator is arranged to generate an oscillating signal according to the control signal and the digital value. The feedback device is arranged to generate the variable clock to the TDC according to the oscillating signal, wherein the calibrating device calibrates the controllable oscillator to make the oscillating signal have a target oscillating frequency.

According to a second embodiment of the present invention, a frequency calibrating method is disclosed. The frequency calibrating method comprises: converting a timing difference between a reference clock and a variable clock to generate a digital value; generating a control signal according to the digital value and the reference clock; generating an oscillating signal according to the control signal and the digital value; and generating the variable clock according to the oscillating signal, wherein the oscillating signal is calibrated to have a target oscillating frequency according to the control signal.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, electronic equipment manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
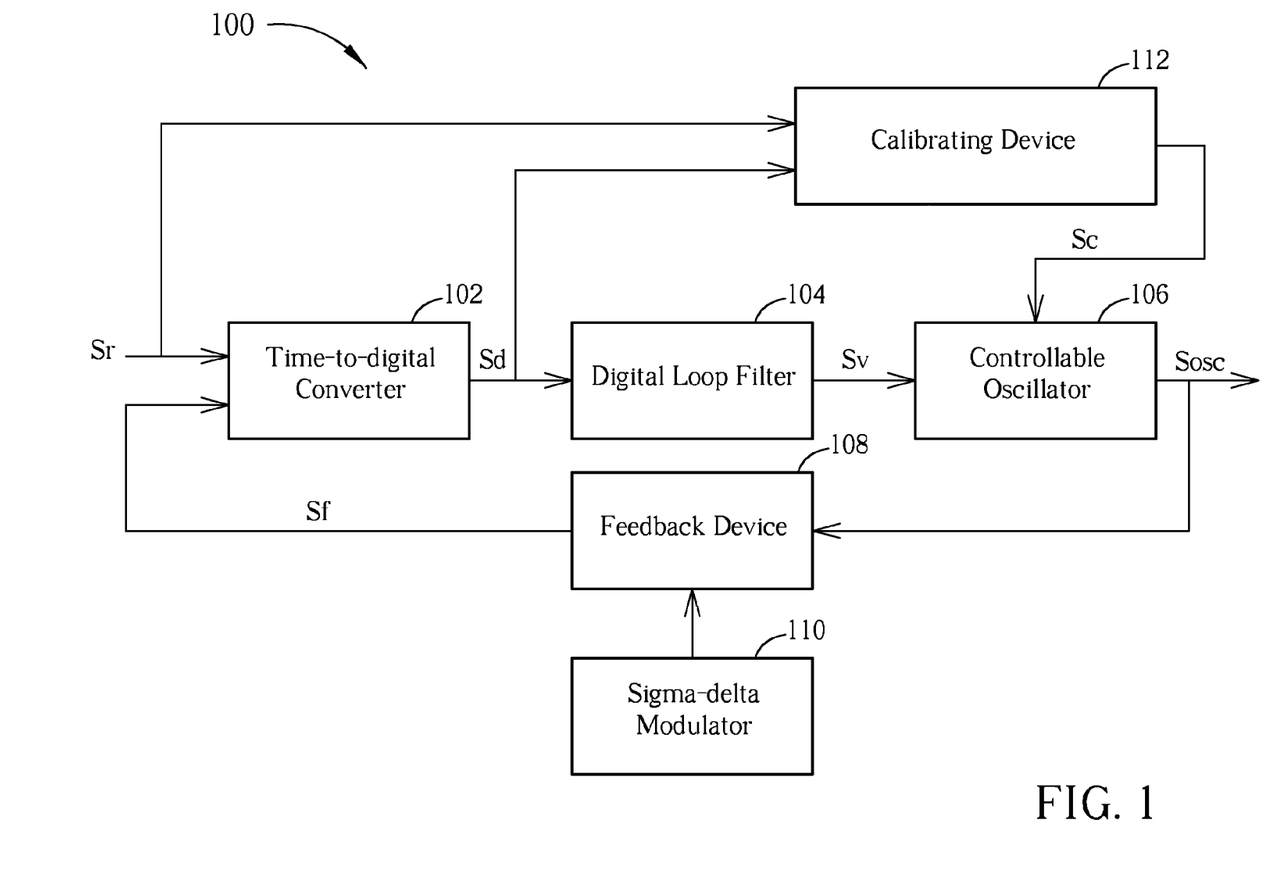
FIG. 1 is a diagram illustrating a clock generating apparatus according to an embodiment of the present invention.

Please refer to FIG. 1, which is a diagram illustrating a clock generating apparatus 100 according to an embodiment of the present invention. The clock generating apparatus 100 may be a phase-locked loop (PLL) in a wireless communication system. The wireless communication system may be a multi-standard communication system, and the clock generating apparatus 100 is capable of generating different oscillating frequencies corresponding to different communications standards. The clock generating apparatus 100 comprises a TDC 102, a digital loop filter 104, a controllable oscillator 106, a feedback device 108, a sigma-delta modulator 110, and a calibrating device 112. The time-to-digital converter 102 is arranged to convert a timing difference between a reference clock Sr and a variable clock Sf to generate a digital value Sd. The loop filter 104 is arranged to generate an oscillator control signal Sv based on the digital value Sd. The calibrating device 112 is arranged to generate a control signal Sc according to the digital value and the reference clock Sr. The controllable oscillator 106 is arranged to generate an oscillating signal Sosc according to the control signal Sc and the oscillator control signal Sv generated based on the digital value Sd. The feedback device 108 is arranged to generate the variable clock Sf to the TDC 102 according to the oscillating signal Sosc. In this exemplary embodiment, the feedback device 108 is a frequency divider arranged to divide the oscillating signal Sosc by an integer M to generate the variable clock Sf, and the integer M is defined as the nearest integer to the target divider ratio, which can make a frequency of the oscillating signal Sosc closest to a target frequency. The digital loop filter 104 is coupled between the TDC 102 and the controllable oscillator 106. The sigma-delta modulator 110 is coupled to the feedback device 108. In this exemplary embodiment, the clock generating apparatus 100 may be an all-digital phase-locked loop (ADPLL), and the controllable oscillator 106 may be a digitally controlled oscillator (DCO) or a voltage controlled oscillator (VCO). The control signals Sc and Sv may be digital control signals.

The calibrating device 112 is arranged to calibrate the controllable oscillator 106 to make the oscillating signal Sosc have a target oscillating frequency Ft, wherein the target oscillating frequency Ft corresponds to a specific communications standard among the various communications standards of the wireless communication system. The digital loop filter 104 and the sigma-delta modulator 110 are disabled while the calibrating device 112 calibrates the controllable oscillator 106, whereas the digital loop filter 104 outputs the oscillator control signal Sv as a static value. In other words, the clock generating apparatus 100 is an open loop when the calibrating device 112 is arranged to calibrate the controllable oscillator 106.

According to the preferred exemplary embodiment, before the wireless communication system operates in the specific communications standard, the clock generating apparatus 100 is controlled to perform a calibrating operation for generating the oscillating signal Sosc having a target oscillating frequency Ft corresponding to the specific communications standard. During the calibration mode, the calibrating device 112 is firstly arranged to calculate a typical signal Styp according to the target oscillating frequency Ft, wherein the typical signal Styp corresponds to a first control signal range R1 which makes the oscillating signal Sosc approximately equal to the target oscillation frequency Ft whenever no manufacturing process variation. Then, the calibrating device 112 performs a first successive approximation (SAR) operation to determine a first control signal Sc1 for the controllable oscillator 106 by successively using a plurality of coarse control signals on the controllable oscillator 106 to generate the oscillating signal Sosc having an oscillating frequency which is approximately equal to the target oscillating frequency Ft. The first control signal Sc1 corresponds to a second control signal range R2 which provides a plurality of fine control signals. In this preferred exemplary embodiment, the first control signal range R1 is smaller than or equal to the maximum controllable range of the controllable oscillator 106, the second control signal range R2 at least partially overlaps the first control signal range R1, and the calibrating device 112 is further arranged to perform a second successive approximation operation to determine a second control signal Sc2 for the controllable oscillator 106 by successively using the plurality of fine control signals on the controllable oscillator 106 to generate the oscillating signal Sosc having the oscillating frequency substantially equal to the target oscillating frequency Ft. The first control signal Sc1 and the second control signal Sc2 may both be digital control signals. For example, if the amount of bit numbers of the first control signal Sc1 is 11, and the amount of bit numbers of the second control signal Sc2 is 6, then total bit numbers of the target control signal is 17, wherein the previous 11 bits of the first control signal Sc1 are the higher significant bits of the target control signal, and the later 6 bits of the second control signal Sc2 are the lower significant bits of the target control signal.

Figure 2:
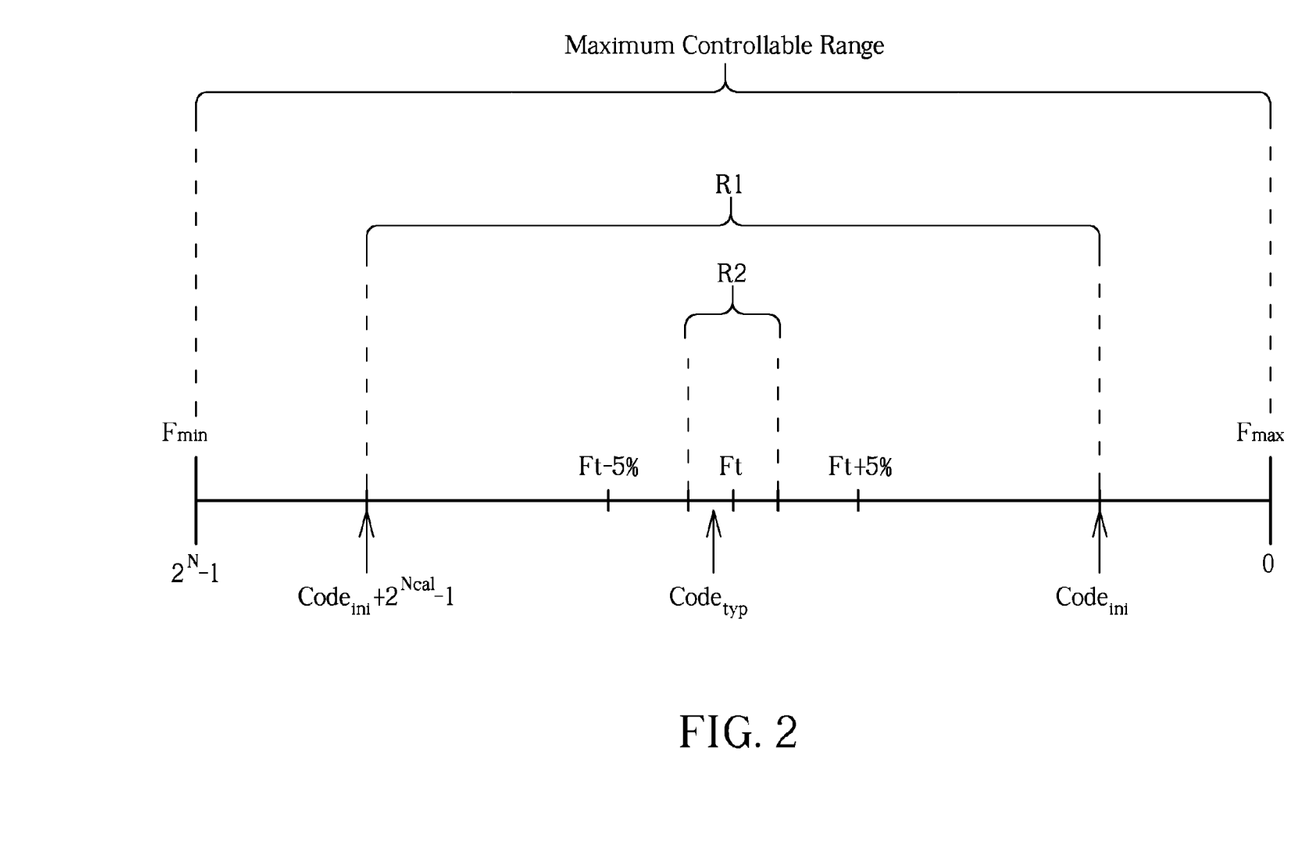
FIG. 2 is a diagram illustrating a total frequency range available for a controllable oscillator according to an embodiment of the present invention.

Please refer to FIG. 2, which is a diagram illustrating the total frequency range available for the controllable oscillator 106. The total frequency range includes the required frequency range of all various communications standards of the multi-standard communication system. The plurality of coarse control signals in the first control signal range R1 maps to the total frequency range. Each of the plurality of coarse control signals comprises a predetermined number of bits, e.g. N bits. The lowest frequency Fmin of the total frequency range corresponds to the value $2^N-1$, and the highest frequency Fmax of the frequency range corresponds to the value of 0. The value $code_{typ}$ is the value corresponding to the typical signal Styp, and the value $code_{typ}$ is the ideal value used to generate the target oscillating frequency Ft. Due to process variations, the controllable oscillator 106 may generate the oscillating signal Sosc far away from the target oscillating frequency Ft when the control signal Sc corresponding to the value $code_{typ}$ is inputted to the controllable oscillator 106. More specifically, the oscillating frequency of the oscillating signal Sosc may have a certain degree of deviation determined by process variation (e.g., 5%) as shown in FIG. 2. Therefore, the calibrating device 112 first performs the first successive approximation (SAR) operation to calibrate the control signal Sc to make the controllable oscillator 106 generate the oscillating signal Sosc having the oscillating frequency approximate to the target oscillating frequency Ft, i.e. performs the coarse tuning of the controllable oscillator 106 to obtain the first control signal Sc1 as shown in FIG. 3.

Figure 3:
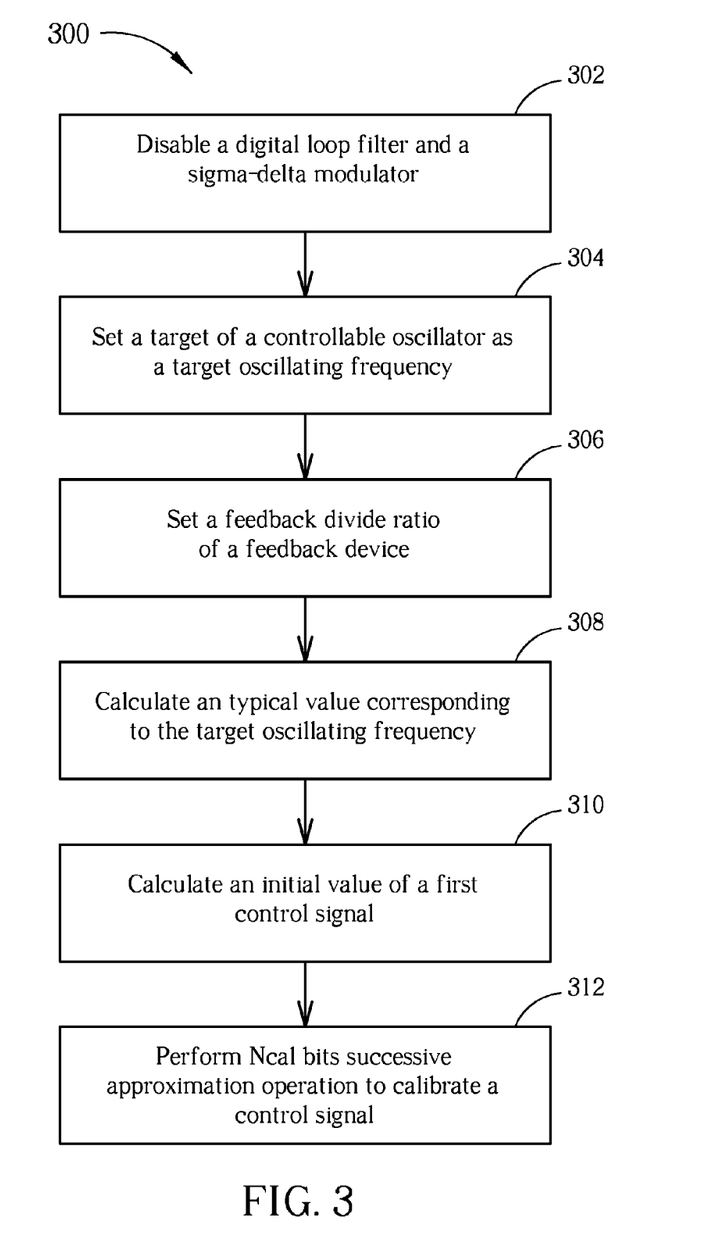
FIG. 3 is a flowchart illustrating a coarse tuning method of a clock generating apparatus according to an embodiment of the present invention.

FIG. 3 is a flowchart illustrating the coarse tuning method 300 of the clock generating apparatus 100 according to an embodiment of the present invention. Provided that substantially the same result is achieved, the steps of the flowchart shown in FIG. 3 need not be in the exact order shown and need not be contiguous; that is, other steps can be intermediate. The coarse tuning method 300 comprises the following steps:

Step 302: Disable the digital loop filter 104 and the sigma-delta modulator 110;

Step 304: Set the target of the controllable oscillator 106 as the target oscillating frequency Ft;

Step 306: Set the feedback divide ratio (i.e. the integer M) of the feedback device 108 to the nearest integer of the target divider ratio;

Step 308: Calculate the typical value $code_{typ}$ corresponding to the target oscillating frequency Ft by the following equation (1):

$$code_{typ} = \text{round}\left( (2^N - 1) \cdot \left[ \left(\frac{F_{max}}{Ft}\right)^2 - 1 \right] \bigg/ \left[ \left(\frac{F_{max}}{F_{min}}\right)^2 - 1 \right] \right); \quad (1)$$

Step 310: Calculate an initial value $code_{ini}$ of the first control signal Sc1 by the following equation (2), in which the initial value $code_{ini}$ is an offset added to the typical value $code_{typ}$, wherein Ncal is the bit number of the SAR operation:

$$code_{ini} = code_{typ} - 2^{Ncal-1}, Ncal <= N; \quad (2)$$

Step 312: Perform the SAR operation, starting from the most significant bit (MSB) to the least significant bit (LSB) of the Ncal bits. The SAR result is denoted as $code_{SAR}$ while the code sent by the control signal Sc to the input of controllable oscillator 106 is $code_{ini} + code_{SAR}$. The control signal Sc makes the controllable oscillator 106 generate the oscillating signal Sosc having the oscillating frequency approximately equal to the target oscillating frequency Ft.

For brevity, the following description assumes that the total bit number of the control signal Sc is 17 bits, and the first control signal Sc1 is represented by 11 higher significant bits (i.e. N=11), and the second control signal Sc2 is represented by 6 lower significant bits. In other words, the first control signal Sc1 is an 11-bit digital signal, and the second control signal Sc2 is a 6-bit digital signal.

In step 308, the one-to-one mapping between the typical value $code_{typ}$ and the target oscillating frequency Ft may be first pre-stored in a table, and the calibrating device 112 may directly read the typical value $code_{typ}$ with respect to the target oscillating frequency Ft or perform an interpolation to obtain the typical value $code_{typ}$. When the initial value code is obtained in step 310, an offset having Ncal bits is to be determined in the step 312.

Figure 4:
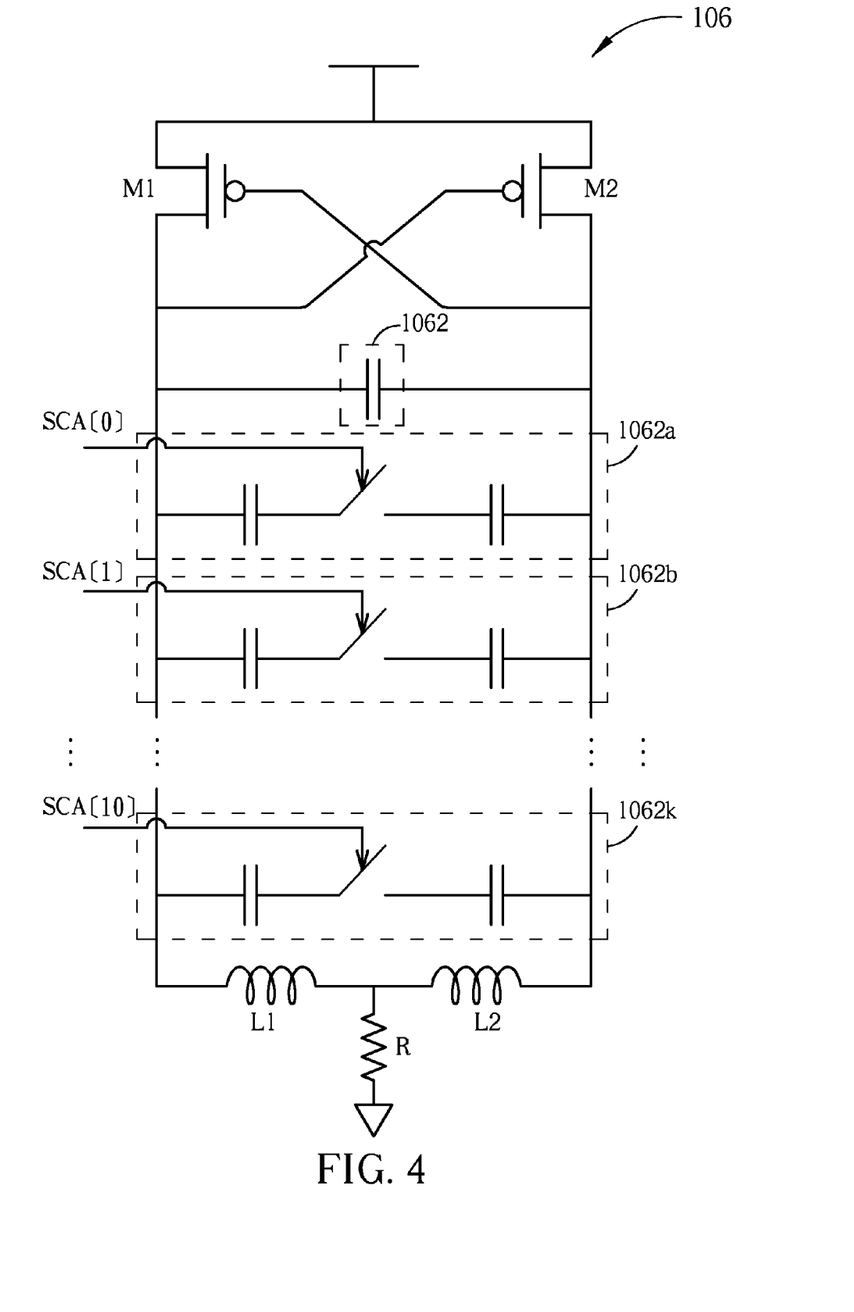
FIG. 4 is a diagram illustrating a controllable oscillator according to an embodiment of the present invention.

Please refer to FIG. 4, which is a diagram illustrating the controllable oscillator 106 according to an embodiment of the present invention. In this exemplary embodiment, the controllable oscillator 106 only receives the 11-bits of the first control signal Sc1, and the bits of the second control signal Sc2 are omitted here for brevity. The controllable oscillator 106 comprises two cross-coupled transistors M1, M2, a capacitor 1062 having a fixed capacitance $C_{FIX}$, a plurality of switching capacitors 1062a-1062k, two inductors L1, L2 each having inductance L, and a resistor R representing practical loss in the inductor. The connectivity between the above elements has been illustrated in FIG. 4, and the detailed description is omitted here for brevity. Each of the plurality of switching capacitors 1062a-1062k comprises two capacitors and one switch, and each switch is controlled by one bit in the first control signal Sc1. More specifically, the capacitance of the first switching capacitor 1062a is $\Delta C$, the capacitance of the second switching capacitor 1062b is $2*\Delta C$, the capacitance of the third switching capacitor 1062c is $2^2*\Delta C$, ..., and the capacitance of the eleventh switching capacitor 1062k is $2^{10}*\Delta C$. The LSB of the first control signal Sc1 controls the switch in the first switching capacitor 1062a, the bit next to the LSB of the first control signal Sc1 controls the switch in the second switching capacitor 1062b, ..., and the MSB of the first control signal Sc1 controls the switch in the eleventh switching capacitor 1062k. Therefore, the oscillating frequency (i.e., $f_{osc}$) of the oscillating signal Sosc can be obtained by the following equations (3) and (4):

$$f_{osc} = \frac{1}{2\pi\sqrt{L(C_{FIX}+C_{SCA})}}, \quad (3)$$

$$C_{SCA} = \Delta C \times \sum_{i=0}^{10}(2^i \times SCA[i]). \quad (4)$$

The parameter SCA[i] is the value of the i-th bit of the first control signal Sc1.

In step 310, when the initial value $code_{ini}$ is calculated by the calibrating device 112, the calibrating device 112 starts to output the control signal Sc to the controllable oscillator 106 to perform the SAR operation (Step 312). For instance, assume Ncal=10 and N=11. In step 312, an initial value of the first control signal Sc1 can be determined by the following equation (5):

$$code_{MSB}=code_{ini}+10'b1000000000. \quad (5)$$

The term "10'b1000000000" represents the value of the 10-bit digital signal with the MSB of 1 and the other bits (i.e. the other 9 bits) of 0. The MSB is calibrated to be 0 or 1 by frequency comparison. The next value of the first control signal Sc1 can be determined by the following equation (6) after the previous bit is determined:

$$code_{MSB-1}=code_{ini}+10'bx100000000. \quad (6)$$

The "x" in equation (6) represents the bit value 0 or 1 which has been determined in previous step. The term "10'bx100000000" represents the value of the 10-bit digital signal with the bit next to the MSB of 1 and the other bits (i.e. the other 8 bits) of 0. The bit next to the MSB is calibrated to be 0 or 1 by frequency comparison. By the same token, the final value of the first control signal Sc1 can be determined by the following equation (7) after the value of the bit more significant to the LSB is determined:

$$code_{LSB}=code_{ini}+10'bxxxxxxxxx1. \quad (7)$$

More specifically, in step 310, when the initial value code is obtained by the calibrating device 112, the calibrating device 112 then outputs the control signal Sc corresponding to the $code_{MSB}$ of equation (5) to the controllable oscillator 106. The calibrating device 112 receives the reference clock Sr and the digital value Sd to determine if the oscillating frequency of the oscillating signal Sosc is higher or lower than the target oscillating frequency Ft. The value of the $code_{MSB-1}$ can be determined according to the comparison result.

When the value of the $code_{MSB-1}$ is determined, the calibrating device 112 outputs the control signal Sc corresponding to the $code_{MSB-1}$ of equation (6) to the controllable oscillator 106. Similarly, the calibrating device 112 receives the reference clock Sr and the digital value Sd to determine if the oscillating frequency of the oscillating signal Sosc is higher or lower than the target oscillating frequency Ft. The value of the $code_{MSB-2}$ can be determined according to the comparison result. By the same token, the value of all bits of the first control signal Sc1 can be determined by the successively inputting the updated control signal Sc to the controllable oscillator 106 and comparing if the updated oscillating frequency of the oscillating signal Sosc is higher or lower than the target oscillating frequency Ft.

It should be noted that the 11 bits obtained through the above first successive approximation operation is the coarse control signal that only makes the controllable oscillator 106 generate the oscillating signal Sosc having the oscillating frequency approximately equal to the target oscillating frequency. According to the exemplary embodiment, when all bits of the first control signal Sc1 are obtained, the calibrating device 112 further can perform the second successive approximation operation to determine the other 6 less significant bits of the control signal Sc, i.e. the second control signal Sc2. The second control signal Sc2 is the fine control signal for the controllable oscillator 106 to generate the oscillating signal Sosc having the oscillating frequency substantially equal to the target oscillating frequency Ft. By using the method similar to the first successive approximation operation, those skilled in the art will understand how to determine the value of the 6 bits of the second control signal Sc2 by successively inputting the updated control signal Sc to the controllable oscillator 106 and comparing if the updated oscillating frequency of the oscillating signal Sosc is higher or lower than the target oscillating frequency Ft; the detailed description is therefore omitted here for brevity.

The target control signal that controls the controllable oscillator 106 to generate the oscillating signal Sosc having the oscillating frequency substantially equal to the target oscillating frequency Ft can be obtained by combining the first control signal Sc1 and the second control signal Sc2. If the first control signal Sc1 is an 11-bit digital control signal and the second control signal Sc2 is a 6-bit digital control signal, then the target control signal is a 17-bit digital control signal.

It should be noted that, according to the above-mentioned description related to the calibrating device 112, the calibrating device 112 is arranged to perform a local search operation centered on the typical signal Styp (i.e. the first control signal range R1) rather than searching the total available frequency range to find the first control signal Sc1 for the controllable oscillator 106, and the first control signal Sc1 is applied to control the controllable oscillator 106 to generate the oscillating signal Sosc to have the oscillating frequency fall within a frequency range including the target oscillating frequency Ft. The calibrating device 112 is arranged to perform searching upon the second control signal range R2 (i.e. the second successive approximation operation) to determine the second control signal Sc2 for the controllable oscillator 106, thereby generating the oscillating signal Sosc having the oscillating frequency substantially equal to the target oscillating frequency Ft.

As stated in the above paragraph, during the first successive approximation operation and the second successive approximation operation, each time the calibrating device 112 outputs the control signal Sc to the controllable oscillator 106, the calibrating device 112 may receive the reference clock Sr and the digital value Sd to determine if the oscillating frequency of the oscillating signal Sosc is higher or lower than the target oscillating frequency Ft. In the exemplary embodiment, the calibrating device 112 uses the following equation (8) to determine the oscillating frequency (i.e., $f_{osc}$) of the oscillating signal Sosc:

$$f_{osc} = \frac{Y \cdot M}{Y \cdot T_{ref} + \Delta t_1 - \Delta t_2}. \quad (8)$$

The parameter M is the dividend of the frequency divider (i.e. the feedback device 108). The parameter Y is the number of clock cycles of the reference clock Sr used to determine the oscillating frequency of the oscillating signal Sosc, the parameter $T_{ref}$ is the period of the clock cycle of the reference clock Sr, the parameter $\Delta t_1$ is the starting time difference between the clock edges of the reference clock Sr and the variable clock Sf, and the parameter $\Delta t_2$ is the ending time difference between the clock edges of the reference clock Sr and the variable clock Sf as shown in FIG. 5.

Figure 5:
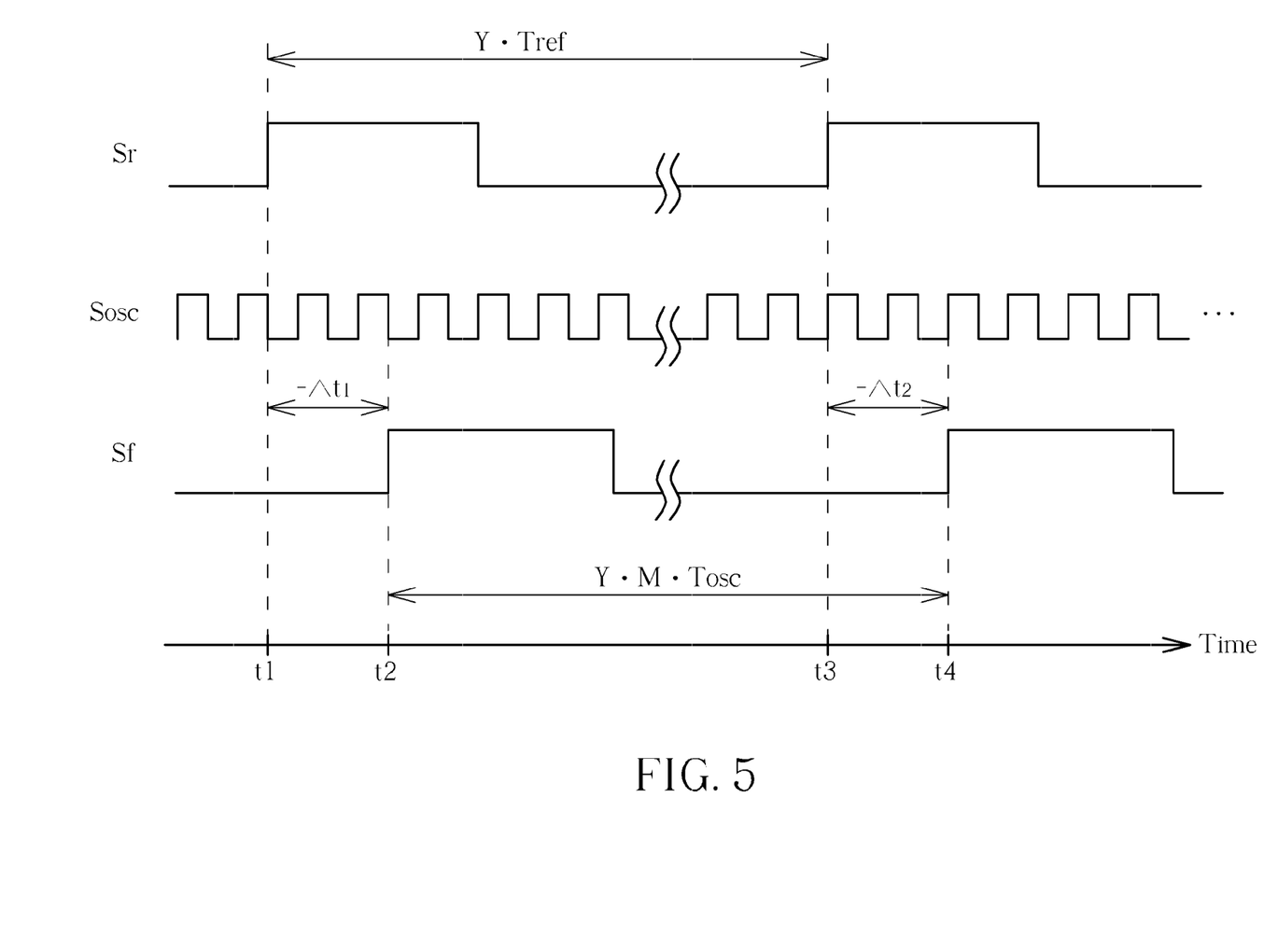
FIG. 5 is a timing diagram illustrating a reference clock, an oscillating signal, and a variable clock according to an embodiment of the present invention.

FIG. 5 is a timing diagram illustrating the reference clock Sr, the oscillating signal Sosc, and the variable clock Sf according to an embodiment of the present invention. According to the exemplary embodiment, the parameter Y is an adjustable number for the calibrating device 112.

When the calibrating device 112 is enabled to calculate the oscillating frequency (i.e. $f_{osc}$) of the oscillating signal Sosc, the calibrating device 112 starts to count the clock cycle of the reference clock Sr at time t1, and the time-to-digital converter 102 is arranged to convert the delay time (i.e., $\Delta t_1$) between the rising edge of the reference clock Sr (i.e. t1) and the rising edge of the variable clock Sf (i.e. t2) to accordingly generate the digital value Sd to the calibrating device 112. After Y number of clock cycles of the reference clock Sr, i.e. t3, the calibrating device 112 stops counting the clock cycle of the reference clock Sr at time t3, and the time-to-digital converter 102 is arranged to convert the delay time (i.e. $\Delta t_2$) between the rising edge of the reference clock Sr (i.e. t3) and the rising edge of the variable clock Sf (i.e. t4) to accordingly generate the digital value Sd to the calibrating device 112. When the delay times $\Delta t_1$, $\Delta t_2$, are obtained by the calibrating device 112, the calibrating device 112 may use the equation (8) to determine the oscillating frequency (i.e. $f_{osc}$) of the oscillating signal Sosc. Accordingly, when the oscillating frequency (i.e. $f_{osc}$) of the oscillating signal Sosc is calculated by the calibrating device 112, the calibrating device 112 may be able to compare the oscillating frequency of the oscillating signal Sosc and the target oscillating frequency Ft for setting the above-mentioned bit value in the control signal Sc according to the comparison result. It should be noted that the parameter $T_{osc}$ in FIG. 5 represents the period of the oscillating signal Sosc.

The time interval (i.e. $Y \cdot T_{ref}$) of the reference clock Sr used for computing one bit in the first control signal Sc1 is smaller than the time interval of the reference clock Sr used for computing one bit in the second control signal Sc2. More specifically, the time interval of the reference clock Sr used to determine the value of the higher significant bit in the control signal Sc is smaller than the time interval of the reference clock Sr used to determine the value of the lower significant bit in the control signal Sc. Therefore, the clock cycle number Y of the reference clock Sr used to determine the value of the higher significant bit in the control signal Sc is smaller than or equal to the clock cycle number Y of the reference clock Sr used to determine the value of the lower significant bit in the control signal Sc. This is because the oscillating frequency of the oscillating signal Sosc may still be far away from the target oscillating frequency Ft in the beginning of the first few SAR operations (i.e. the determination of the value of the higher significant bit (e.g., MSB) of the control signal Sc), which may lead to the TDC device 102 input exceed the maximum allowed hardware limitation. During the calibration of the value of the lower significant bit (e.g. LSB), the oscillating frequency of the oscillating signal Sosc may be close to the target oscillating frequency Ft. According to the following equation (9) illustrating the error of the oscillating frequency of the oscillating signal Sosc calculated by the calibrating device 112, the error (i.e. $\Delta T_{osc}$) of the oscillating period of the oscillating signal Sosc is determined by the time interval (i.e. $Y \cdot T_{ref}$) of the reference clock Sr used for computing one bit of the control signal Sc and the delay times $\Delta t_1$, $\Delta t_2$ between the reference clock Sr and the variable clock Sf.

$$\frac{\Delta T_{osc}}{T_{osc}} = \frac{(1 - g_{TDC}) \cdot (\Delta t_1 - \Delta t_2) + \Delta TDC}{Y \cdot T_{ref} + (\Delta t_1 - \Delta t_2)} \quad (9)$$

The parameter $g_{TDC}$ is the gain error of the TDC 102, and the parameter $\Delta TDC$ is the differential non-linearity (DNL) error of TDC 102. Therefore, during the higher significant bit (e.g. MSB) calibration, the calibration time (i.e. $Y \cdot T_{ref}$) should be small so that the delay time $\Delta t_2$ does not exceed the maximum allowed HW limitation. During the lower significant bit (e.g., LSB) calibration, the calibration time (i.e. $Y \cdot T_{ref}$) should be large so that the error (i.e. $\Delta T_{osc}$) of the oscillating frequency of the oscillating signal Sosc is small enough.

Figure 6:
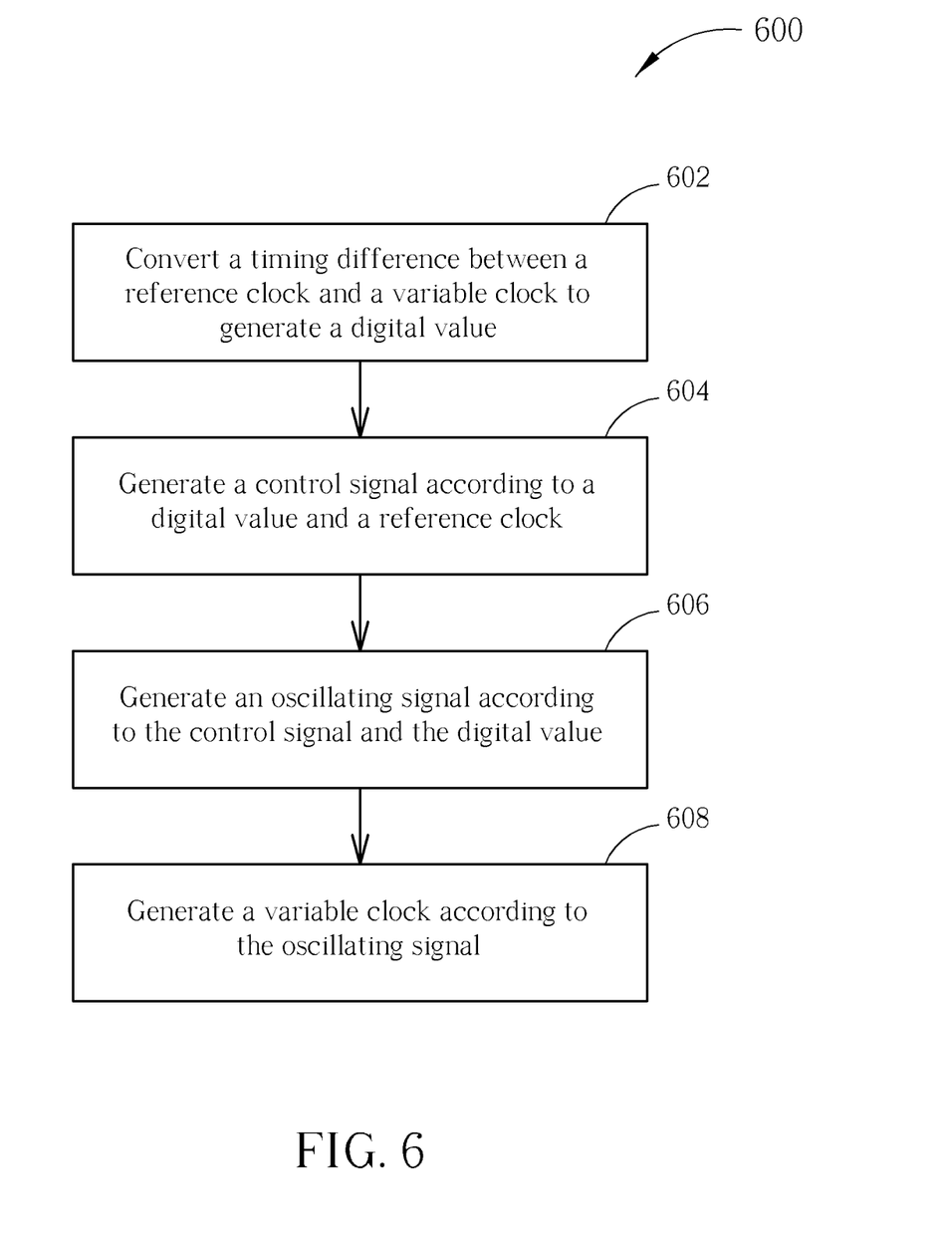
FIG. 6 is a flowchart illustrating a frequency calibrating method according to an embodiment of the present invention.

According to the exemplary embodiment, the operation of the clock generating apparatus 100 can be summarized as the steps shown in FIG. 6. FIG. 6 is a flowchart illustrating a frequency calibrating method 600 according to an embodiment of the present invention. Provided that substantially the same result is achieved, the steps of the flowchart shown in FIG. 6 need not be in the exact order shown and need not be contiguous; that is, other steps can be intermediate. The frequency calibrating method 600 comprises:

Step 602: Convert a timing difference between the reference clock Sr and the variable clock Sf to generate a digital value Sd;

Step 604: Generate the control signal Sc according to the digital value Sd and the reference clock Sr;

Step 606: Generate the oscillating signal Sosc according to the control signal Sc and the digital value Sd; and Step 608: Generate the variable clock Sf according to the oscillating signal Sosc, wherein the oscillating signal Sosc is calibrated to have the target oscillating frequency Ft according to the control signal Sc.

In step 602, the timing difference between the reference clock Sr and the variable clock Sf is converted to the digital value Sd by utilizing a TDC. In step 604, the initial signal Sini is calculated according to the target oscillating frequency Ft, the first SAR operation is performed to determine the first control signal Sc1 by successively using the plurality of coarse control signals for generating the oscillating signal Sosc so that the oscillating frequency is approximately equal to the target oscillating frequency Ft, and the second successive approximation operation is further performed to determine the second control signal Sc2 by successively using the plurality of fine control signals for generating the oscillating signal Sosc so that the oscillating frequency is substantially equal to the target oscillating frequency Ft. The target control signal that controls the controllable oscillator 106 to generate the oscillating signal Sosc having the oscillating frequency substantially equal to the target oscillating frequency Ft is the combination of the first control signal Sc1 and the second control signal Sc2. When the clock generating apparatus 100 is calibrated to generate the oscillating signal Sosc having the target oscillating frequency Ft, the wireless communication system is able to operate under the specific communications standard among the various communications standards.

Briefly, the above-mentioned exemplary embodiments are arranged to perform a local search operation centered on a typical signal under an open loop to find the control signal for a controllable oscillator of a phase-locked loop, and the control signal is applied to control the controllable oscillator to generate the oscillating signal having an oscillating frequency that falls within a frequency range including the target oscillating frequency. Accordingly, by using the local search operation instead of searching the whole range of the control signal corresponding to all the various communications standards, the present calibrating device is capable of shortening the calibrating time of a phase-locked loop to generate the target frequency in a multi-standard communication system.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A clock generating apparatus, comprising:
a time-to-digital converter (TDC), arranged to convert a timing difference between a reference clock and a variable clock to generate a digital value;
a calibrating device, arranged to generate a control signal according to the digital value and the reference clock;
a controllable oscillator, arranged to generate an oscillating signal according to the control signal and the digital value;
a feedback device, arranged to generate the variable clock to the TDC according to the oscillating signal;
a digital loop filter, coupled between the time-to-digital converter and the controllable oscillator; and
a sigma-delta modulator, coupled to the feedback device;

wherein the calibrating device calibrates the controllable oscillator to make the oscillating signal have a target oscillating frequency, and the digital loop filter and the sigma-delta modulator are disabled while the calibrating device is calibrating the controllable oscillator.

2. The clock generating apparatus of claim 1, wherein the feedback device is a frequency divider arranged to divide the oscillating signal by an integer to generate the variable clock; and the integer is a nearest integer to a target value which makes a frequency of the oscillating signal closest to a target frequency.

3. The clock generating apparatus of claim 1, wherein the clock generating apparatus is an all-digital phase-locked loop (ADPLL), and the ADPLL is configured to have an open loop while the calibrating device is calibrating the controllable oscillator.

4. The clock generating apparatus of claim 1, wherein the controllable oscillator is a digitally controlled oscillator (DCO) or a voltage controlled oscillator (VCO).

5. The clock generating apparatus of claim 1, wherein the calibrating device is arranged to:
calculate a typical signal according to the target oscillating frequency, wherein the typical signal corresponds to a first control signal range which provides a plurality of coarse control signals; and
perform a first successive approximation operation to determine a first control signal for the controllable oscillator by successively using the plurality of coarse control signals on the controllable oscillator to generate the oscillating signal to have an oscillating frequency approximately equal to the target oscillating frequency.

6. The clock generating apparatus of claim 5, wherein the first control signal range is smaller than or equal to a maximum controllable range of the controllable oscillator.

7. The clock generating apparatus of claim 5, wherein the feedback device is a frequency divider, and the calibrating device is further arranged to compute the oscillating frequency of the controllable oscillator by using at least the digital value, a dividend of the frequency divider, and a time interval of the reference clock, where the time interval corresponds to a time for the calibrating device to compute one bit in the first control signal.

8. The clock generating apparatus of claim 5, wherein the first control signal corresponds to a second control signal range which provides a plurality of fine control signals, the second control signal range at least partially overlaps the first control signal range, and the calibrating device is further arranged to perform a second successive approximation operation to determine a second control signal for the controllable oscillator by successively using the plurality of fine control signals on the controllable oscillator to generate the oscillating signal to have the oscillating frequency substantially equal to the target oscillating frequency.

9. The clock generating apparatus of claim 8, wherein the feedback device comprises a frequency divider, and the calibrating device further computes the oscillating frequency of the controllable oscillator by using at least the digital value, a dividend of the frequency divider, and a time interval of the reference clock, where the time interval is for the calibrating device to compute one bit in the second control signal.

10. The clock generating apparatus of claim 8, wherein a time interval of the reference clock used for computing one bit in the first control signal is smaller than or equal to the time interval of the reference clock used for computing one bit in the second control signal.

11. The clock generating apparatus of claim 1, wherein the calibrating device is arranged to perform a local search operation centered on the typical signal to find the control signal for the controllable oscillator, and the control signal controls the controllable oscillator to generate the oscillating signal to have the oscillating frequency fall within a frequency range including the target oscillating frequency.

* * * * *